(12) United States Patent
Fu

(10) Patent No.: US 10,481,201 B2
(45) Date of Patent: Nov. 19, 2019

(54) MULTI-TURRET HANDLER

(71) Applicant: Winbond Electronics Corp., Taichung (TW)

(72) Inventor: Ting-Ming Fu, Hsinchu County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 177 days.

(21) Appl. No.: 15/724,584

(22) Filed: Oct. 4, 2017

(65) Prior Publication Data

US 2018/0210028 A1 Jul. 26, 2018

(30) Foreign Application Priority Data

Jan. 26, 2017 (CN) .......................... 2017 1 0057396

(51) Int. Cl.
*G01R 31/28* (2006.01)
*G01R 1/04* (2006.01)

(52) U.S. Cl.
CPC ........ *G01R 31/2893* (2013.01); *G01R 1/0433* (2013.01)

(58) Field of Classification Search
CPC ................ G01R 1/0466; G01R 31/043; G01R 31/2868; G01R 31/2874; G01R 31/2893
See application file for complete search history.

(56) References Cited

U.S. PATENT DOCUMENTS

| 2008/0007285 A1* | 1/2008 | Nakase .............. G01R 31/2893 324/750.03 |
| 2013/0207679 A1 | 8/2013 | Cheng et al. |
| 2016/0216322 A1* | 7/2016 | Cheung .............. G01R 31/2893 |

FOREIGN PATENT DOCUMENTS

CN          101989535 B       9/2013

OTHER PUBLICATIONS

US 9,274,163 B2, 03/2016, Long et al. (withdrawn)

* cited by examiner

*Primary Examiner* — Tung X Nguyen
(74) *Attorney, Agent, or Firm* — Muncy, Geissler, Olds & Lowe, P.C.

(57) ABSTRACT

A multi-turret handler adapted to test a plurality of electronic elements is provided. The multi-turret handler includes a main turret and a test turret. The main turret includes a plurality of pickers. The test turret includes a plurality of movable brackets and a test unit. The test unit includes a plurality of lead pushers and a plurality of sockets. The movable brackets are moveable between a first position and a second position. When the movable bracket is in the first position, the pickers respectively pick and place the electronic elements on the movable brackets. When the movable brackets are in the second position, the movable brackets correspond to the sockets, and the lead pushers are respectively inserted into the movable brackets and the sockets to test the electronic elements.

8 Claims, 10 Drawing Sheets

MULTI-TURRET HANDLER

CROSS REFERENCE TO RELATED APPLICATIONS

This application claims priority of China Patent Application No. 201710057396.7, filed on Jan. 26, 2017, the entirety of which is incorporated by reference herein.

BACKGROUND OF THE INVENTION

Field of the Invention

The present invention relates to a multi-turret handler, and in particular to a multi-turret handler with increased testing efficiency.

Description of the Related Art

In a conventional turret handler, the turret has a main plate with a plurality of pickers. To increase the number of electronic elements that can be tested in one single test procedure, the diameter of the main plate is increased to increase the number of pickers. However, the increased number of pickers increases the weight of the main plate, and inertia caused by high-speed rotation is generated. If the rotation speed is decreased to prevent the inertia problem, the index time is increased, and the time and cost of the test procedure is therefore increased.

BRIEF SUMMARY OF THE INVENTION

In one embodiment, a multi-turret handler adapted to test a plurality of electronic elements is provided. The multi-turret handler includes a main turret and a test turret. The main turret includes a plurality of pickers. The test turret includes a plurality of movable brackets and a test unit. The test unit includes a plurality of lead pushers and a plurality of sockets. The movable brackets are moveable between a first position and a second position. When the movable bracket is in the first position, the pickers respectively pick and place the electronic elements on the movable brackets. When the movable brackets are in the second position, the movable brackets correspond to the sockets, and the lead pushers are respectively inserted into the movable brackets and the sockets to test the electronic elements.

In one embodiment, the test turret further comprises a controller, the sockets are coupled to the controller, and the controller tests the electronic elements via the sockets.

In one embodiment, the test turret further comprises a transmission plate, and the moveable brackets are disposed on and rotated with the transmission plate.

In one embodiment, the main turret further comprises a main plate, the pickers are disposed on the main plate, and the pickers are rotated with the main plate.

In one embodiment, the main plate and the transmission plate form an intersection area on a projection plane, and when the moveable brackets are in the first position, one of the moveable brackets is in the intersection area and corresponds to one of the pickers, and the picker picks and places the electronic element on the moveable bracket in the intersection area.

In one embodiment, the transmission plate comprises a plurality of transmission belts, and the transmission belts move the moveable bracket between the first position and the second position.

In one embodiment, the transmission plate further comprises a plurality of first wheels and a plurality of second wheels, the transmission belts are rotated by the first wheel and the second wheel, and the moveable bracket is sandwiched between the transmission belts which are adjacent and parallel to each other.

In one embodiment, the test turret further comprises a shaft, an end of the shaft is connected to the transmission plate, the transmission plate is moved between a first height and a second height relative to the shaft, the shaft comprises a plurality of rack strips, and each rack strip meshes with and rotates the first wheel.

In one embodiment, the transmission plate further comprises a plurality of rack rails and a plurality of actuators, each actuator is connected to the moveable bracket, the actuator meshes with the rack rails, and the actuator moves along the rack rails to move the moveable bracket between the first position and the second position.

In one embodiment, the multi-turret handler further comprises a marking inspection plate, wherein the marking inspection plate is located between the main turret and the test turret, the marking inspection plate comprises a plurality of receiving portions, the electronic elements to be inspected are placed on the receiving portions by the pickers, and the electronic elements are moved to the moveable bracket by the pickers from the receiving portions after being inspected.

In the multi-turret handler of the embodiment of the invention, the electronic elements are tested by the test turret, and the number of pickers is independent of the number of sockets (in other words, the number of pickers is not increased with the number of electronic elements to be tested in one single test procedure). Therefore, high-speed rotation can be implemented and not limited by the inertia problem caused by the increased pickers. Besides, since the lead pushers and the sockets are not rotatable, the number of lead pushers and sockets can be increased as required without generating the inertia problem. Further, the weight of the movable brackets is low, so that the number of movable brackets can be increased as required without generating the inertia problem. Utilizing the multi-turret handler of the embodiment of the invention, the number of electronic elements to be tested in one single test procedure can be increased to improve test efficiency and to decrease test cost. Additionally, in one embodiment, one single main turret can be utilized with a plurality of test turrets, and the test efficiency can be improved further. A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
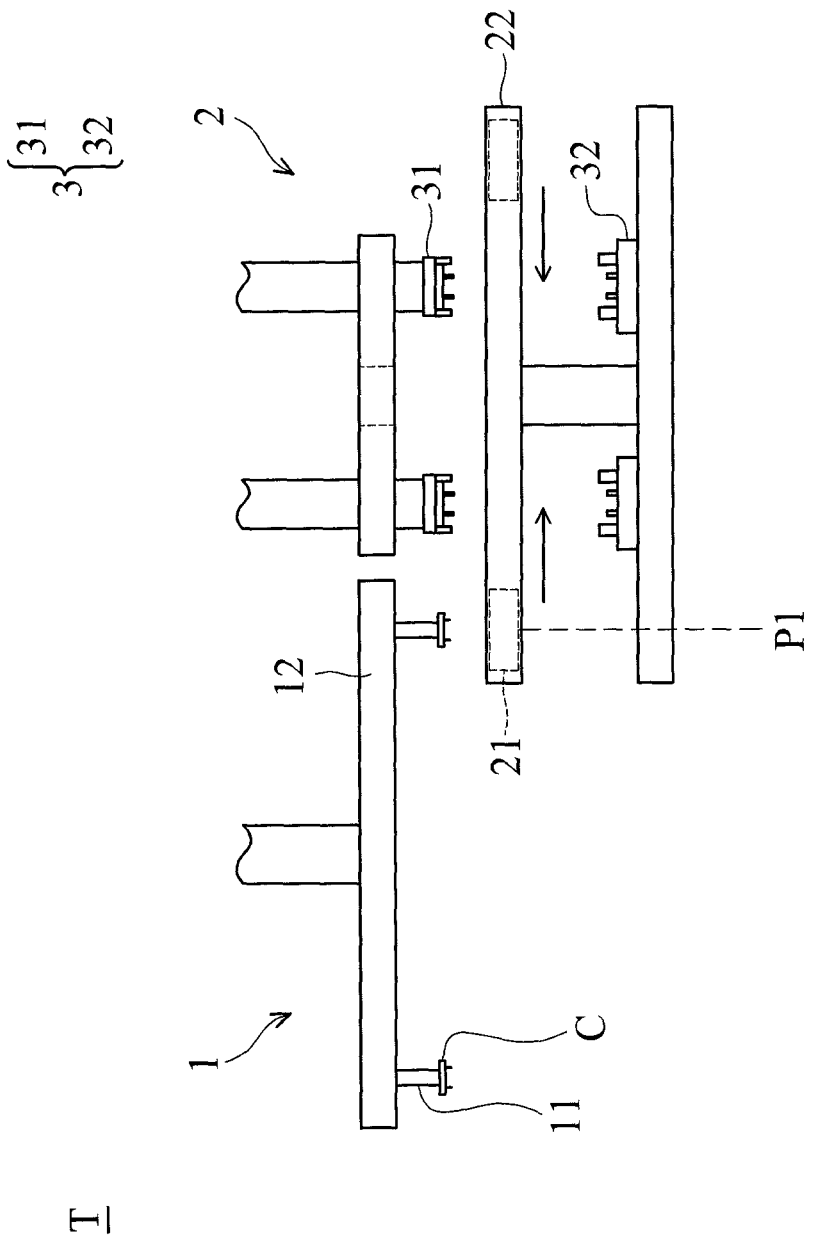
FIG. 1A shows the multi-turret handler of an embodiment of the invention, wherein the electronic element is going to be put into the movable bracket.
Figure 1B:
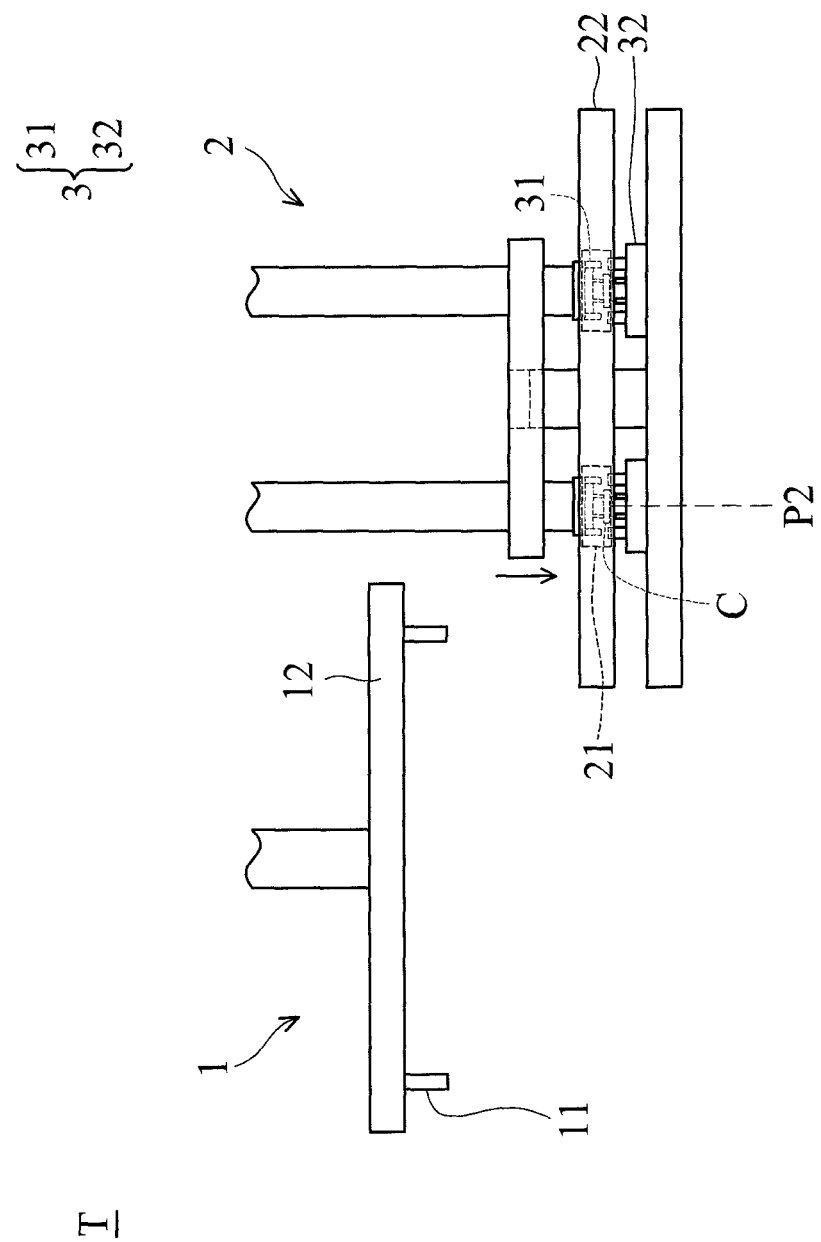
FIG. 1B shows the multi-turret handler of the embodiment of the invention, wherein the electronic element is tested by the test unit.
Figure 1C:
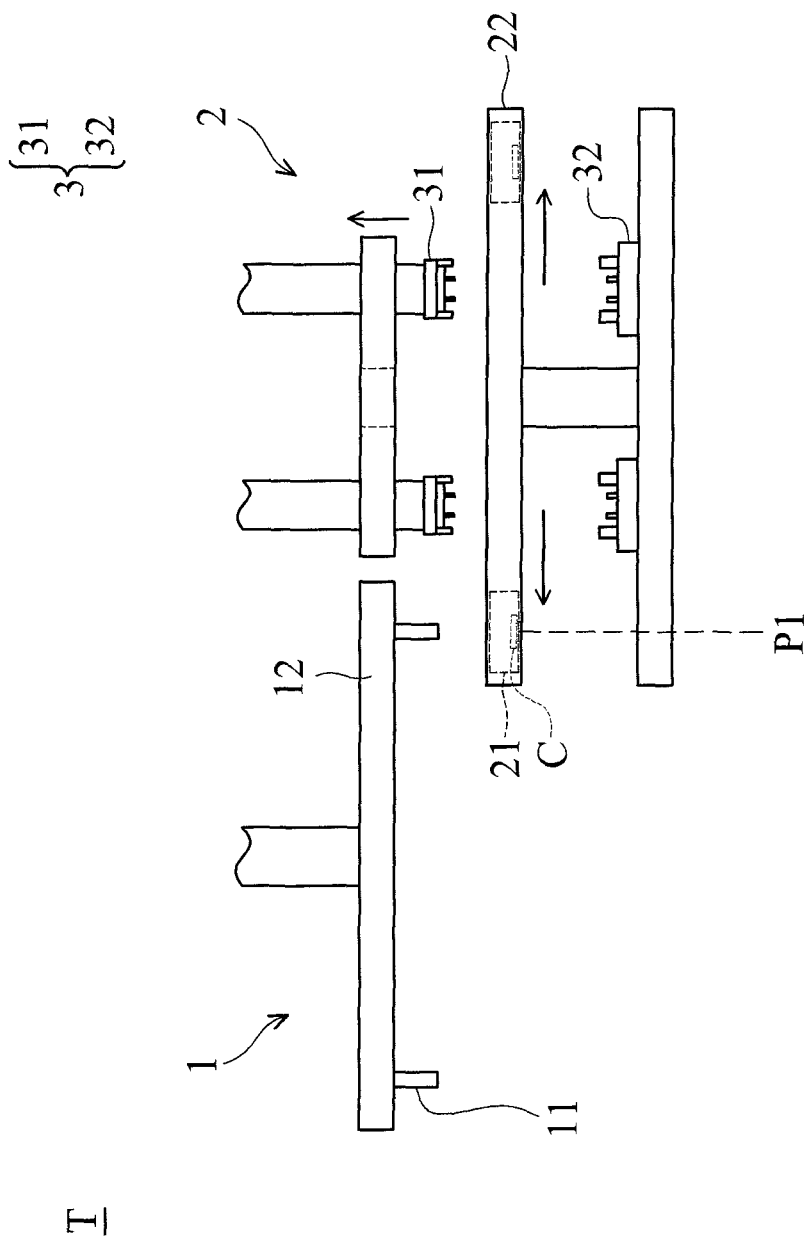
FIG. 1C shows the multi-turret handler of the embodiment of the invention, wherein the electronic element is raised by the picker after test.

FIG. 1A~1C show a multi-turret handler T of an embodiment of the invention. With reference to FIGS. 1A~1C, the multi-turret handler T is adapted to test a plurality of electronic elements C. The multi-turret handler T includes a main turret 1 and a test turret 2. The main turret 1 includes a plurality of pickers 11. The test turret 2 includes a plurality of movable brackets 31 and a test unit 3. The test unit 3 includes a plurality of lead pushers 31 and a plurality of sockets 32. The movable brackets 21 are moveable between a first position P1 (as shown in FIGS. 1A and 1C) and a second position P2 (as shown in FIG. 1B). When the movable bracket 21 is in the first position P1, the pickers 11 respectively pick and place the electronic elements C on the movable brackets 21. When the movable brackets 21 are in the second position P2, the movable brackets 21 correspond to the sockets 32, and the lead pushers 31 are respectively inserted into the movable brackets 21 and the sockets 32 to test the electronic elements C.

To test the electronic elements C, with reference to FIG. 1A, the movable brackets 21 are located in the first position P1 first, and the pickers 11 sequentially place the electronic elements C on the movable brackets 21. Then, with reference to FIG. 1B, the movable brackets 21 are moved to the second position P2, and the electronic elements C are tested via the test unit 3. Next, after the test, with reference to FIG. 1C, the movable brackets 21 are moved to the first position P1, and the pickers 11 pick the electronic elements C from the movable brackets 21 sequentially.

Figure 2:
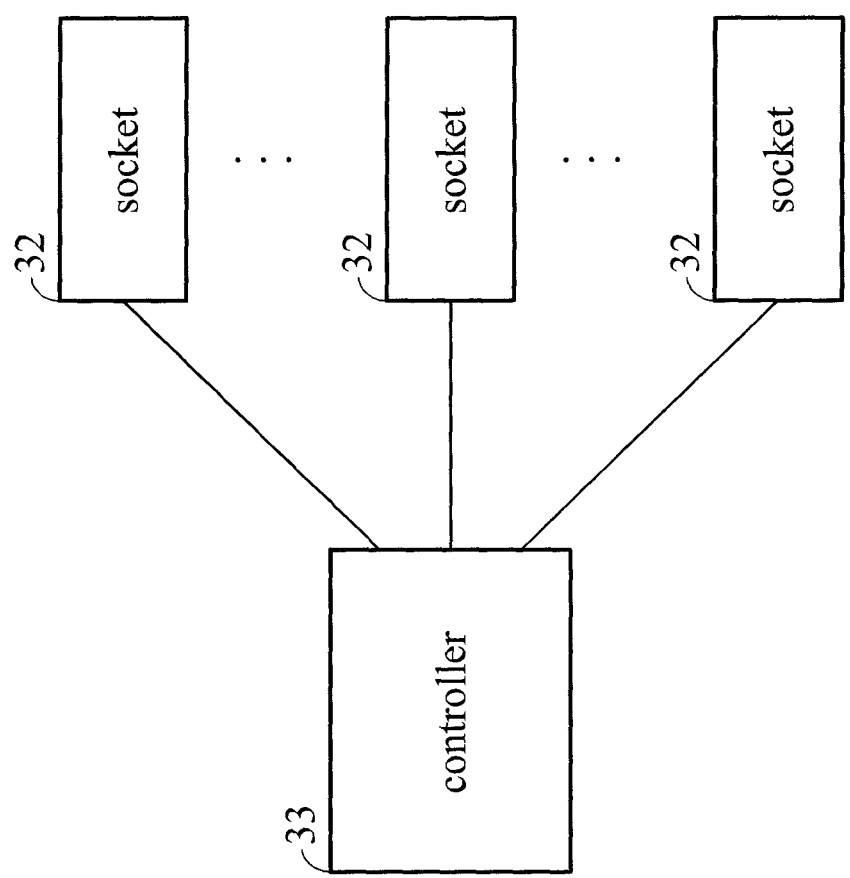
FIG. 2 is a block diagram of the test unit of an embodiment of the invention.

With reference to FIG. 2, in one embodiment, the test turret 2 further includes a controller 33, the sockets 32 are coupled to the controller 33, and the controller 33 tests the electronic elements C via the sockets 32. Generally, the sockets 32 are coupled to the controller 33, and the relative position of each of the sockets 32 with regard to the controller 33 is fixed. However, the disclosure is not meant to restrict the invention. In one embodiment, the sockets 32 are connected to the controller 33 via a plurality of variable-length cables. Compared to the conventional design, the length of the cables can be changed, for example, decreased.

With reference to FIGS. 1A~1C, in one embodiment, the test turret 2 further includes a transmission plate 22, and moveable brackets 21 are disposed on and rotated with the transmission plate 22. The main turret 1 further includes a main plate 12, the pickers 11 are disposed on and rotated with the main plate 12.

With reference to FIGS. 1A~1C and 3, in one embodiment, the main plate 12 and the transmission plate 22 form an intersection area IA on a projection plane. When the moveable brackets 21 are in the first position P1, one of the moveable brackets 21 is in the intersection area IA and corresponds to one of the pickers 11, and the picker 11 picks and places the electronic element C on the moveable bracket 21 in the intersection area IA.

With reference to FIGS. 4A~4D, in one embodiment, the transmission plate 22 includes a plurality of transmission belts 23, and the transmission belts 23 move the moveable bracket 21 between the first position P1 and the second position P2. In one embodiment, the transmission plate 22 further includes a plurality of first wheels 241 and a plurality of second wheels 242, the transmission belts 23 are rotated by the first wheel 241 and the second wheel 242, and the moveable bracket 21 is sandwiched between the two transmission belts 23 which are adjacent and parallel to each other.

In one embodiment, the transmission belts 23 are timing belts. The transmission belts 23 mesh with the first wheel 241 and the second wheel 24, and the positions of the moveable brackets 21 can be positioned precisely. However, the disclosure is not meant to restrict the invention. For example, the moveable brackets 21 can be positioned by stoppers.

Figure 4A:
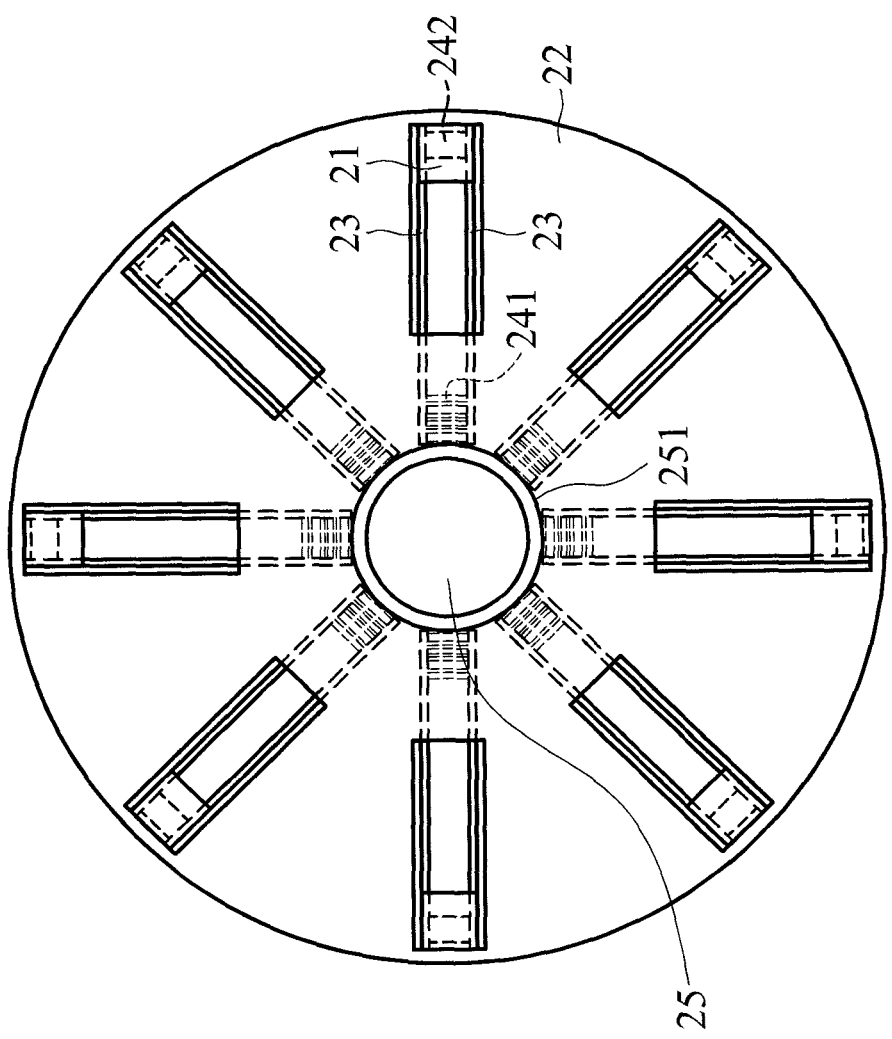
FIG. 4A is a top view of the transmission plate of an embodiment of the invention, wherein the movable brackets are in the first position.
Figure 4B:
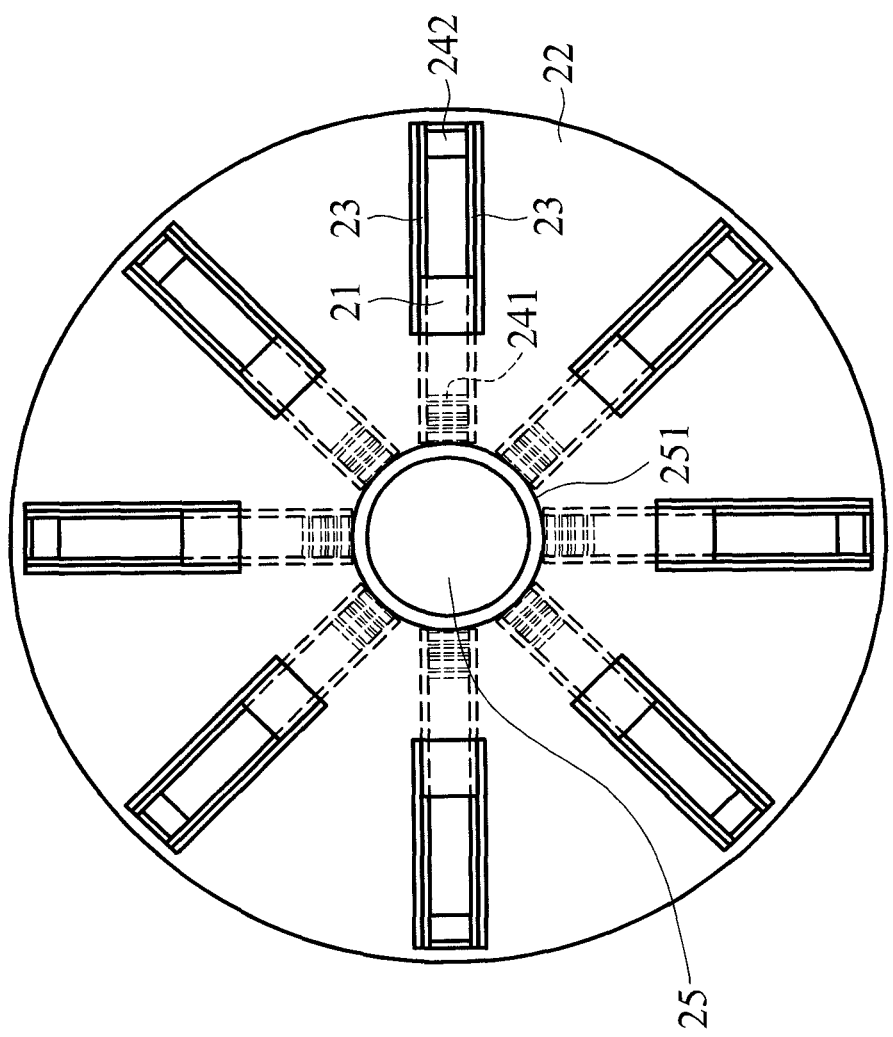
FIG. 4B is the top view of the transmission plate of the embodiment of the invention, wherein the movable brackets are in the second position.
Figure 4C:
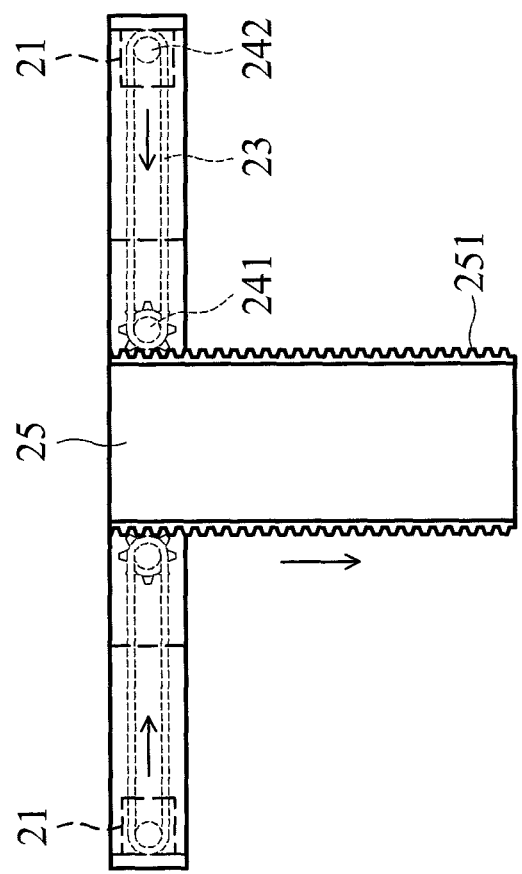
FIG. 4C is a side view of the transmission plate of the embodiment of the invention, wherein the movable brackets are in the first position.
Figure 4D:
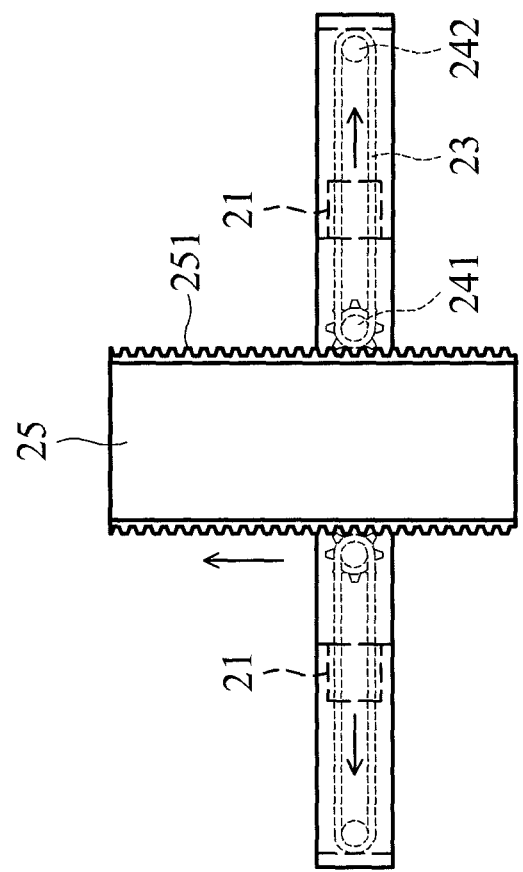
FIG. 4D is the side view of the transmission plate of the embodiment of the invention, wherein the movable brackets are in the second position.

With reference to FIGS. 4A~4D, in one embodiment, the test turret 2 further includes a shaft 25, an end of the shaft 25 is connected to the transmission plate 22, the transmission plate 22 is moved between a first height (as shown in FIG. 4C) and a second height (as shown in FIG. 4D) relative to the shaft 25. The shaft 25 includes a plurality of rack strips 251, and each rack strip 251 meshes with and rotates the first wheel 241.

Figure 5:
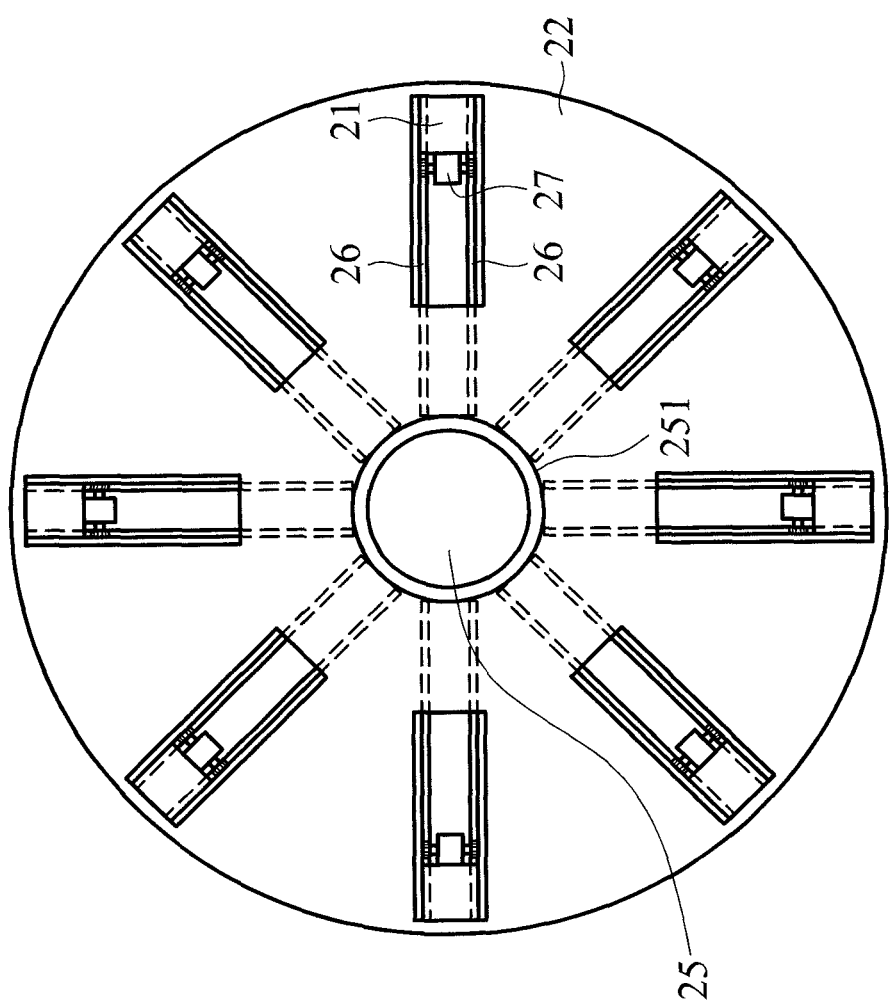
FIG. 5 is a top view of the transmission plate of another embodiment of the invention.

With reference to FIG. 5, in another embodiment, the transmission plate 22 further includes a plurality of rack rails 26 and a plurality of actuators 27. Each actuator 27 is connected to the moveable bracket 21. The actuator 27 meshes with the rack rails 26 via a gear. The actuator 27 moves along the rack rails 26 to move the moveable bracket 21 between the first position P1 and the second position P2. In one embodiment, the actuators 27 can be electric motors.

In the embodiments of the invention, the two different moving means for the moveable brackets are provided. However, the disclosure is not meant to restrict the invention. The moveable brackets can also be moved by other means.

Figure 3:
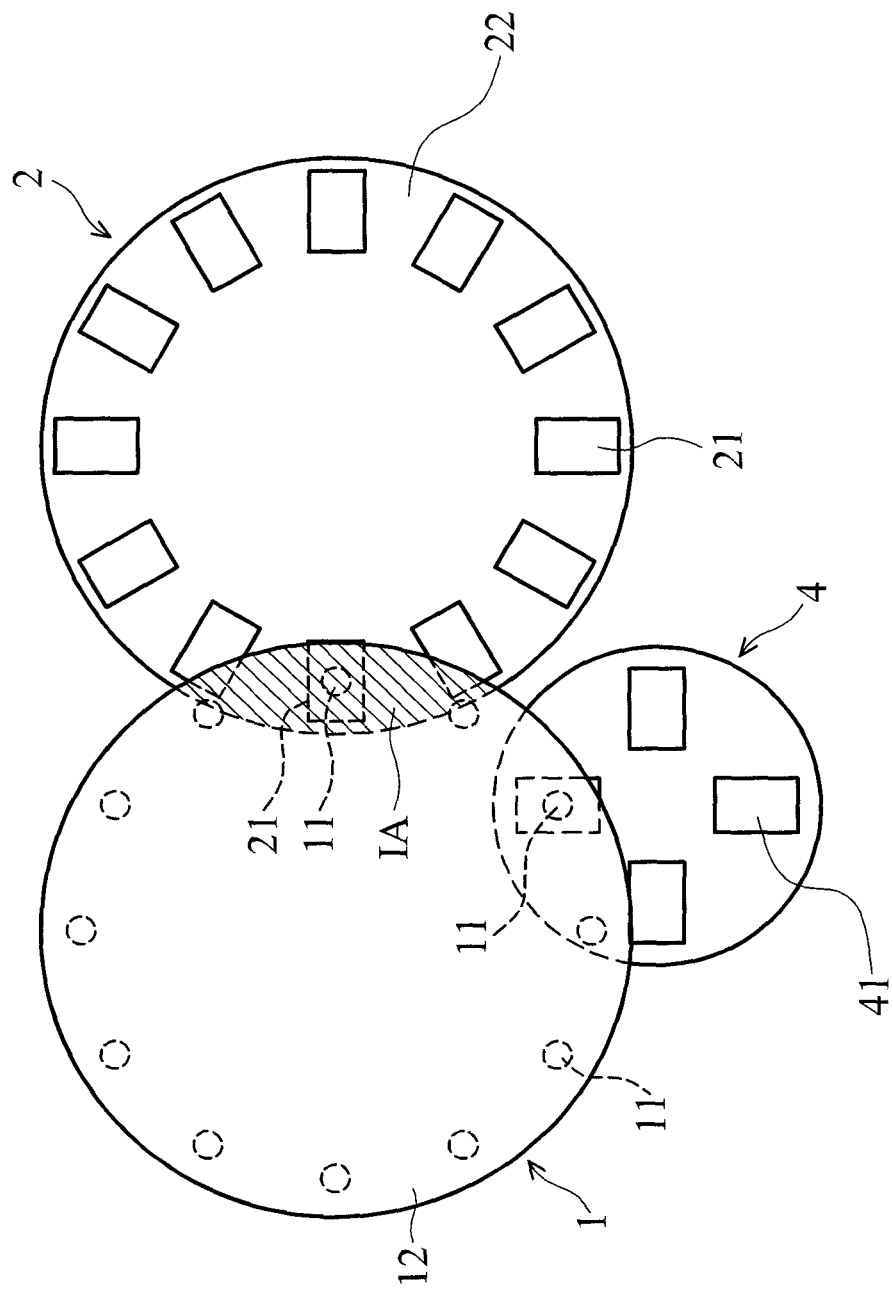
FIG. 3 is a top view of the multi-turret handler of the embodiment of the invention.

With reference to FIG. 3, in one embodiment, the multi-turret handler T further includes a marking inspection plate 4. The marking inspection plate 4 is located between the main turret 1 and the test turret 2. The marking inspection plate 4 includes a plurality of receiving portions 41, the electronic elements C to be inspected are placed on the receiving portions 41 by the pickers 11, and the electronic elements C are moved to the moveable bracket 21 by the pickers 11 from the receiving portions 41 after being inspected.

In the multi-turret handler of the embodiment of the invention, the electronic elements are tested by the test turret, and the number of pickers is independent of the number of sockets (in other words, the number of pickers is not increased with the number of electronic elements to be tested in one single test procedure). The inertia problem caused by high-speed rotation of the increased number of pickers is prevented. Besides, since the lead pushers and the sockets are not rotatable, the number of lead pushers and sockets can be increased as required without generating the inertia problem. Further, the weight of the movable brackets is light, so that the increased number of movable brackets has no inertia problem. Utilizing the multi-turret handler of the embodiment of the invention, the number of electronic elements to be tested in one single test procedure can be increased to improve test efficiency and to decrease test cost. Additionally, in one embodiment, one single main turret can be utilized with a plurality of test turrets, and the test efficiency can be improved further.

In one embodiment, the electronic element includes a plurality of leads. During the testing of the electronic element, the lead pushers press an upper surface of the leads. The leads pass through the opening on the bottom of the movable brackets, and are coupled to the contacts of the sockets. The forces applied to the leads by the lead pushers and the contacts are offset, and the leads are not deformed.

In one embodiment, the test turret can be disposed in a chamber, the temperature inside the chamber can be controlled to satisfy different test requirements.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multi-turret handler, adapted to test a plurality of electronic elements, comprising:
   a main turret, comprising a plurality of pickers; and
   a test turret, comprising:
   a plurality of movable brackets; and
   a test unit, comprising a plurality of lead pushers and a plurality of sockets, wherein the movable brackets are moveable between a first position and a second position, when the movable bracket is in the first position, the pickers respectively pick and place the electronic elements on the movable brackets, and when the movable brackets are in the second position, the movable brackets correspond to the sockets, and the lead pushers are respectively inserted into the movable brackets and the sockets to test the electronic elements,
   wherein the test turret further comprises a controller, the sockets are coupled to the controller, and the controller tests the electronic elements via the sockets, and
   wherein the test turret further comprises a transmission plate, and the moveable brackets are disposed on and rotated with the transmission plate.

2. The multi-turret handler as claimed in claim 1, wherein the main turret further comprises a main plate, the pickers are disposed on the main plate, and the pickers are rotated with the main plate.

3. The multi-turret handler as claimed in claim 2, wherein the main plate and the transmission plate form an intersection area on a projection plane, and when the moveable brackets are in the first position, one of the moveable brackets is in the intersection area and corresponds to one of the pickers, and the picker picks and places the electronic element on the moveable bracket in the intersection area.

4. The multi-turret handler as claimed in claim 1, wherein the transmission plate comprises a plurality of transmission belts, and the transmission belts move the moveable bracket between the first position and the second position.

5. The multi-turret handler as claimed in claim 4, wherein the transmission plate further comprises a plurality of first wheels and a plurality of second wheels, the transmission belts are rotated by the first wheel and the second wheel, and the moveable bracket is sandwiched between the transmission belts which are adjacent and parallel to each other.

6. The multi-turret handler as claimed in claim 5, wherein the test turret further comprises a shaft, an end of the shaft is connected to the transmission plate, the transmission plate is moved between a first height and a second height relative to the shaft, the shaft comprises a plurality of rack strips, and each rack strip meshes with and rotates the corresponding one of the plurality of first wheels.

7. The multi-turret handler as claimed in claim 1, wherein the transmission plate further comprises a plurality of rack rails and a plurality of actuators, each actuator is connected to the moveable bracket, meshes with the rack rails, and moves along the rack rails to move the moveable bracket between the first position and the second position.

8. The multi-turret handler as claimed in claim 1, further comprising a marking inspection plate, wherein the marking inspection plate is located between the main turret and the test turret, the marking inspection plate comprises a plurality of receiving portions, the electronic elements to be inspected are placed on the receiving portions by the pickers, and the electronic elements are moved to the moveable bracket by the pickers from the receiving portions after being inspected.

* * * * *